United States Patent
Smith et al.

(10) Patent No.: US 10,629,429 B2
(45) Date of Patent: Apr. 21, 2020

(54) SELECTIVE DEPOSITION OF SILICON OXIDE

(71) Applicant: Lam Research Corporation, Fremont, CA (US)

(72) Inventors: David Charles Smith, Lake Oswego, OR (US); Dennis M. Hausmann, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/206,915

(22) Filed: Nov. 30, 2018

(65) Prior Publication Data

US 2019/0115207 A1    Apr. 18, 2019

Related U.S. Application Data

(63) Continuation of application No. 15/432,634, filed on Feb. 14, 2017, now Pat. No. 10,176,984.

(51) Int. Cl.
*H01L 21/02* (2006.01)
*C23C 16/40* (2006.01)
(Continued)

(52) U.S. Cl.
CPC ......... *H01L 21/0228* (2013.01); *C23C 16/02* (2013.01); *C23C 16/0272* (2013.01);
(Continued)

(58) Field of Classification Search
CPC ......... H01L 21/02636–02653; H01L 21/2018; H01L 21/2033–2036;
(Continued)

(56) References Cited

U.S. PATENT DOCUMENTS

| | | | |
|---|---|---|---|
| 4,539,061 A | 9/1985 | Sagiv | |
| 6,423,582 B1 * | 7/2002 | Fischer | H01L 23/5256 257/529 |

(Continued)

FOREIGN PATENT DOCUMENTS

| | | |
|---|---|---|
| JP | 2013-079447 A | 5/2013 |
| KR | 10-2017-0016310 A | 2/2017 |

(Continued)

OTHER PUBLICATIONS

U.S. Office Action, dated Nov. 16, 2017, issued in U.S. Appl. No. 15/432,634.

(Continued)

*Primary Examiner* — Selim U Ahmed
*Assistant Examiner* — Evan G Clinton
(74) *Attorney, Agent, or Firm* — Weaver Austin Villeneuve & Sampson LLP

(57) ABSTRACT

Methods and apparatuses for selectively depositing silicon oxide on a silicon oxide surface relative to a silicon nitride surface are described herein. Methods involve pre-treating a substrate surface using ammonia and/or nitrogen plasma and selectively depositing silicon oxide on a silicon oxide surface using alternating pulses of an aminosilane silicon precursor and an oxidizing agent in a thermal atomic layer deposition reaction without depositing silicon oxide on an exposed silicon nitride surface.

16 Claims, 6 Drawing Sheets

US 10,629,429 B2
Page 2

(51) Int. Cl.
   *C23C 16/04* (2006.01)
   *C23C 16/455* (2006.01)
   *H01L 21/3105* (2006.01)
   *C23C 16/02* (2006.01)
   *H01L 21/32* (2006.01)

(52) U.S. Cl.
   CPC ............ *C23C 16/04* (2013.01); *C23C 16/401* (2013.01); *C23C 16/402* (2013.01); *C23C 16/45525* (2013.01); *H01L 21/02164* (2013.01); *H01L 21/02211* (2013.01); *H01L 21/02219* (2013.01); *H01L 21/02274* (2013.01); *H01L 21/02315* (2013.01); *H01L 21/3105* (2013.01); *H01L 21/32* (2013.01)

(58) Field of Classification Search
   CPC ... H01L 21/2053–2056; H01L 21/2085; H01L 21/28562; H01L 21/76262; H01L 21/76278; H01L 21/76294; H01L 21/76879; H01L 51/0011; H01L 21/0228; H01L 21/02211; H01L 21/02274; H01L 21/02164; C23C 14/04–048; C23C 16/45525; C23C 16/04; C23C 16/402
   See application file for complete search history.

(56) References Cited

U.S. PATENT DOCUMENTS

| | | |
|---|---|---|
| 6,593,000 B2 | 7/2003 | Ohtake et al. |
| 7,728,436 B2 | 6/2010 | Whelan et al. |
| 7,875,312 B2 | 1/2011 | Thridandam et al. |
| 8,043,907 B2 | 10/2011 | Ma et al. |
| 8,530,361 B2 | 9/2013 | Xiao et al. |
| 8,592,005 B2 | 11/2013 | Ueda |
| 8,668,957 B2 | 3/2014 | Dussarrat et al. |
| 8,821,986 B2 | 9/2014 | Weidman et al. |
| 8,853,075 B2 | 10/2014 | Gatineau et al. |
| 8,940,648 B2 | 1/2015 | Xiao et al. |
| 8,945,305 B2 | 2/2015 | Marsh |
| 9,219,007 B2 | 12/2015 | Chen et al. |
| 9,257,334 B2 | 2/2016 | Chen et al. |
| 9,331,094 B2 | 5/2016 | Hada |
| 9,371,338 B2 | 6/2016 | Dussarrat et al. |
| 9,911,595 B1 | 3/2018 | Smith et al. |
| 10,043,656 B1 | 8/2018 | Smith et al. |
| 10,176,984 B2 | 1/2019 | Smith et al. |
| 10,199,212 B2 | 2/2019 | Smith et al. |
| 10,242,866 B2 | 3/2019 | Smith et al. |
| 2004/0166680 A1 | 8/2004 | Miyajima et al. |
| 2004/0259378 A1 | 12/2004 | Chambers et al. |
| 2005/0017319 A1 | 1/2005 | Manabe et al. |
| 2005/0091931 A1 | 5/2005 | Gracias |
| 2005/0208778 A1 | 9/2005 | Li et al. |
| 2006/0128142 A1 | 6/2006 | Whelan et al. |
| 2008/0032064 A1 | 2/2008 | Gordon et al. |
| 2008/0237861 A1 | 10/2008 | Dominguez et al. |
| 2008/0242097 A1 | 10/2008 | Boescke et al. |
| 2011/0178092 A1 | 7/2011 | Ali et al. |
| 2011/0256721 A1 | 10/2011 | Gatineau |
| 2012/0205315 A1 | 8/2012 | Liu et al. |
| 2012/0315740 A1 | 12/2012 | Yao |
| 2013/0017328 A1 | 1/2013 | Miyoshi et al. |
| 2013/0323435 A1 | 12/2013 | Xiao et al. |
| 2014/0113457 A1 | 4/2014 | Sims et al. |
| 2014/0252486 A1 | 9/2014 | Lin et al. |
| 2014/0363969 A1 | 12/2014 | Chen et al. |
| 2015/0004806 A1 | 1/2015 | Ndiege et al. |
| 2015/0014823 A1 | 1/2015 | Mallikarjunan et al. |
| 2015/0087139 A1 | 3/2015 | O'Neill et al. |
| 2015/0111374 A1 | 4/2015 | Bao et al. |
| 2015/0147871 A1 | 5/2015 | Xiao et al. |
| 2015/0155523 A1 | 6/2015 | Kamiya |
| 2015/0235835 A1 | 8/2015 | Swaminathan et al. |
| 2015/0299848 A1 | 10/2015 | Haukka et al. |
| 2015/0340225 A1 | 11/2015 | Kim et al. |
| 2015/0364372 A1 | 12/2015 | Chen et al. |
| 2015/0371896 A1 | 12/2015 | Chen et al. |
| 2016/0024647 A1 | 1/2016 | Saly et al. |
| 2016/0056074 A1 | 2/2016 | Na et al. |
| 2016/0079521 A1 | 3/2016 | Draeger et al. |
| 2016/0126106 A1 | 5/2016 | Shimizu et al. |
| 2016/0280724 A1 | 9/2016 | Arkles et al. |
| 2016/0322213 A1 | 11/2016 | Thompson et al. |
| 2016/0376152 A1 | 12/2016 | Toutonghi |
| 2017/0004974 A1 | 1/2017 | Manna et al. |
| 2017/0029947 A1 | 2/2017 | Kawahara et al. |
| 2017/0029948 A1 | 2/2017 | Jongbloed et al. |
| 2017/0148642 A1 | 5/2017 | Wang et al. |
| 2017/0338109 A1 | 11/2017 | Lei et al. |
| 2018/0233349 A1 | 8/2018 | Smith et al. |
| 2018/0261447 A1 | 9/2018 | Smith et al. |
| 2018/0261448 A1 | 9/2018 | Smith et al. |
| 2018/0269058 A1 | 9/2018 | Smith et al. |
| 2018/0308680 A1 | 10/2018 | Reddy et al. |
| 2019/0148128 A1 | 5/2019 | Smith et al. |
| 2019/0157076 A1 | 5/2019 | Hausmann et al. |

FOREIGN PATENT DOCUMENTS

| | | |
|---|---|---|
| WO | WO 2014/209327 | 12/2014 |
| WO | WO 2016/048336 | 3/2016 |
| WO | WO 2016/138284 | 9/2016 |
| WO | WO 2016/209570 | 12/2016 |

OTHER PUBLICATIONS

U.S. Final Office Action dated May 3, 2018 issued in U.S. Appl. No. 15/432,634.
U.S. Notice of Allowance dated Sep. 6, 2018 issued in U.S. Appl. No. 15/432,634.
U.S. Notice of Allowance, dated Oct. 20, 2017, issued in U.S. Appl. No. 15/462,695.
U.S. Office Action, dated Feb. 8, 2018, issued in U.S. Appl. No. 15/453,815.
U.S. Notice of Allowance, dated Oct. 5, 2018, issued in U.S. Appl. No. 15/453,815.
U.S. Notice of Allowance, dated Oct. 23, 2017, issued in U.S. Appl. No. 15/456,301.
U.S. Notice of Allowance, dated Feb. 13, 2018, issued in U.S. Appl. No. 15/456,301.
U.S. Notice of Allowance, dated Sep. 25, 2018, issued in U.S. Appl. No. 15/975,554.
U.S. Office Action, dated Nov. 1, 2018, issued in U.S. Appl. No. 15/581,951.
International Search Report and Written Opinion dated Jun. 25, 2018 issued in Application No. PCT/US2018/021823.
Chabal* et al. (2016) "Atomic Layer Deposition of Silicon Dioxide Using Aminosilanes Di-sec-butylaminosilane and Bis(tert-butylamino)silane with Ozone,"*The Journal of Physical Chemistry C*, ACS Publications, American Chemical Society, 120:10927-10935.
Chen, Rong and Bent*, Stacey F. (2006) "Chemistry for Positive Pattern Transfer Using Area-Selective Atomic Layer Deposition," *Adv. Mater.*, 18:1086-1090.
Chen et al. (2011) "Ozone-Based Atomic Layer Deposition of Crystalline $V_2O_5$ Films for High Performance Electrochemical Energy Storage," *Chemistry of Materials*, ACS Publications, American Chemical Society, 7pp.
Dangerfield et al. (2016) "Role of Trimethylaluminum (TMA) for Low Temperature $SiN_x$ Deposition: Growth Dependence on Number of TMA Exposures," *ALD Conference 2016*, 14pp.
Han et al. (2012) "On the Mechanisms of $SiO_2$ Thin-Film Growth by the Full Atomic Layer Deposition Process Using Bis(t-butylamino)silane on the Hydroxylated SiO2(001) Surface," *The Journal of Physical Chemistry C*, ACS Publications, American Chemical Society, 116:947-952.
Huang et al. (2017) "Design of efficient mono-aminosilane precursors for atomic layer deposition of $SiO_2$ thin films," *Royal Society of Chemistry Adv. 2017*, 7:22672-22678.

(56) References Cited

OTHER PUBLICATIONS

Li et al. (2014) "Low Temperature (LT) Thermal ALD Silicon Dioxide Using Ozone Process," *Arradiance Inc.*, Sudbury, MA USA, 1 page.
Liu et al. (Jun. 26-29, 2011) "High Rate Growth of $SiO_2$ by Thermal ALD Using Tris(di-methylamino)silane and Ozone," ALD 2011, *Cambridge NanoTech Inc.*, Cambridge, MA, USA, 14pp.
Ooba et al. (1998) "Self-Limiting Atomic-layer Selective Deposition of Silicon Nitride by Temperature-Controlled Method," *Extended Abstracts of the 1998 International Conference on Solid State Devices and Materials*, Hiroshima, pp. 22-23.
Putkonen et al. (2014) "Thermal and plasma enhanced atomic layer deposition of $SiO_2$ using commercial silicon precursors," *Thin Solid Films*, 558:93-98.
Sundstrom, (Dec. 2005) "Ozone as the Oxidizing Precursor in Atomic Layer Deposition," *Gas & Chemicals, MKS Instruments, Inc.*, Wilmington, MA, 4pp.
Yokoyama et al. (1998) "Atomic-layer selective deposition of silicon nitride on hydrogen-terminated Si surfaces," *Applied Surface Science*, 130-132, 352-356.
U.S. Appl. No. 15/821,590, filed Nov. 22, 2017, Hausmann et al.
U.S. Office Action, dated Feb. 25, 2019, issued in U.S. Appl. No. 15/878,349.
U.S. Notice of Allowance, dated Jul. 24, 2019, issued in U.S. Appl. No. 15/878,349.
U.S. Final Office Action dated Jun. 19, 2019, issued in U.S. Appl. No. 15/581,951.
U.S. Notice of Allowance dated Jun. 19, 2019, issued in U.S. Appl. No. 15/821,590.
International Search Report and Written Opinion dated Mar. 13, 2019 issued in Application No. PCT/US2018/062301.

\* cited by examiner

SELECTIVE DEPOSITION OF SILICON OXIDE

CROSS-REFERENCE TO RELATED APPLICATION

This application claims benefit of U.S. Provisional patent application Ser. No. 15/432,634, filed Feb. 14, 2017, and titled "SELECTIVE DEPOSITION OF SILICON OXIDE," which is incorporated by reference herein in its entirety and for all purposes.

BACKGROUND

Semiconductor device fabrication includes fabrication of microprocessors, logic, and memory devices. Such devices may be fabricated using a variety of techniques, including self-aligned patterning such as double patterning or quad patterning, gapfill processes, and other techniques. Some processes involve formation of structures that include silicon oxide and silicon nitride. Conventional techniques for forming such structures may be limited to patterning techniques that include both etch and deposition.

SUMMARY

Provided herein are methods and apparatuses for processing semiconductor substrates. One aspect involves a method of depositing silicon oxide selectively on an exposed silicon oxide surface, the method including: providing a substrate having the exposed silicon oxide surface and an exposed silicon nitride surface, the exposed silicon nitride surface including primary amine groups; exposing the substrate to a aminosilane to adsorb the aminosilane to the exposed silicon oxide surface; and performing a thermal atomic layer deposition reaction including exposing the substrate to an oxidizing agent, whereby the thermal atomic layer deposition reaction selectively forms silicon oxide on the exposed silicon oxide surface relative to the exposed silicon nitride surface.

In some embodiments, the method also includes prior to providing the substrate, depositing silicon nitride to form an untreated silicon nitride surface; and exposing the untreated silicon nitride surface to ammonia and igniting a plasma for a duration between about 1 second and about 10 seconds to form the exposed silicon nitride surface including primary amine groups. In some embodiments, the plasma is ignited using a plasma power between about 150 W and about 6000 W.

In some embodiments, the method also includes prior to providing the substrate, depositing silicon nitride to form an untreated silicon nitride surface and exposing the untreated silicon nitride surface to a mixture of nitrogen and ammonia and igniting a plasma for a duration between about 1 second and about 10 seconds to form the exposed silicon nitride surface including primary amine groups. The plasma may be ignited using a plasma power between about 150 W and about 6000 W. In some embodiments, the amount of ammonia in the mixture of nitrogen and ammonia is less than about 1% by volume. In some embodiments, the mixture of ammonia gas and nitrogen gas includes a flow rate ratio of ammonia gas flow rate to nitrogen gas flow rate between about 0.01 and about 0.1. In various embodiments, the ammonia gas flow rate is between about 10 sccm and about 100 sccm.

In some embodiments, the method also includes forming the exposed silicon nitride surface including primary amine groups by chemical vapor deposition at a deposition temperature greater than about 500° C.

In various embodiments, the thermal atomic layer deposition reaction is performed at a deposition temperature between about 25° C. and about 400° C.

In various embodiments, during the thermal atomic layer deposition reaction, the substrate is housed in a chamber having a chamber pressure between about 10 mTorr and about 10 Torr during selective deposition of the silicon oxide.

In some embodiments, exposing the substrate to the aminosilane precursor includes flowing the aminosilane precursor at a flow rate between about 1000 sccm and about 5000 sccm.

In various embodiments, exposing the substrate to the oxidizing agent includes flowing the oxidizing agent at a flow rate between about 1000 sccm and about 5000 sccm.

In some embodiments, the aminosilane precursor is any one of monoaminosilane, diaminosilane, triaminosilane, tetraaminosilane, and combinations thereof.

The oxidizing agent may be any of ozone, water, peroxide, and combinations thereof.

Another aspect involves an apparatus for processing semiconductor substrates, the apparatus including: at least one process chamber including a pedestal for holding a substrate; at least one outlet for coupling to a vacuum; a plasma generator; one or more process gas inlets coupled to one or more aminosilane gas sources; one or more process gas inlets coupled to one or more nitrogen-containing gas sources; one or more process gas inlets coupled to one or more oxidizing agent gas sources; and a controller for controlling operations in the apparatus, including machine-readable instructions for: introducing a nitrogen-containing gas to the process chamber and igniting a plasma to form a exposed silicon nitride surface including primary amine groups on the substrate; introducing a aminosilane gas to adsorb the aminosilane to an exposed silicon oxide surface of the substrate; and performing a thermal atomic layer deposition reaction including introducing an oxidizing agent whereby the thermal atomic layer deposition reaction selectively forms silicon oxide on the exposed silicon oxide surface relative to the exposed silicon nitride surface.

In some embodiments, the one or more nitrogen-containing sources includes an ammonia source and a nitrogen gas source, and the nitrogen-containing source includes a mixture of ammonia and nitrogen whereby the amount of ammonia in the mixture of nitrogen and ammonia is less than about 1% by volume.

In some embodiments, at least one process chamber includes a first process chamber for treating the substrate using a nitrogen-containing source and plasma, and a second process chamber for introducing the aminosilane source and the oxidizing agent to form silicon oxide.

These and other aspects are described further below with reference to the drawings.

DETAILED DESCRIPTION

Figure 1:
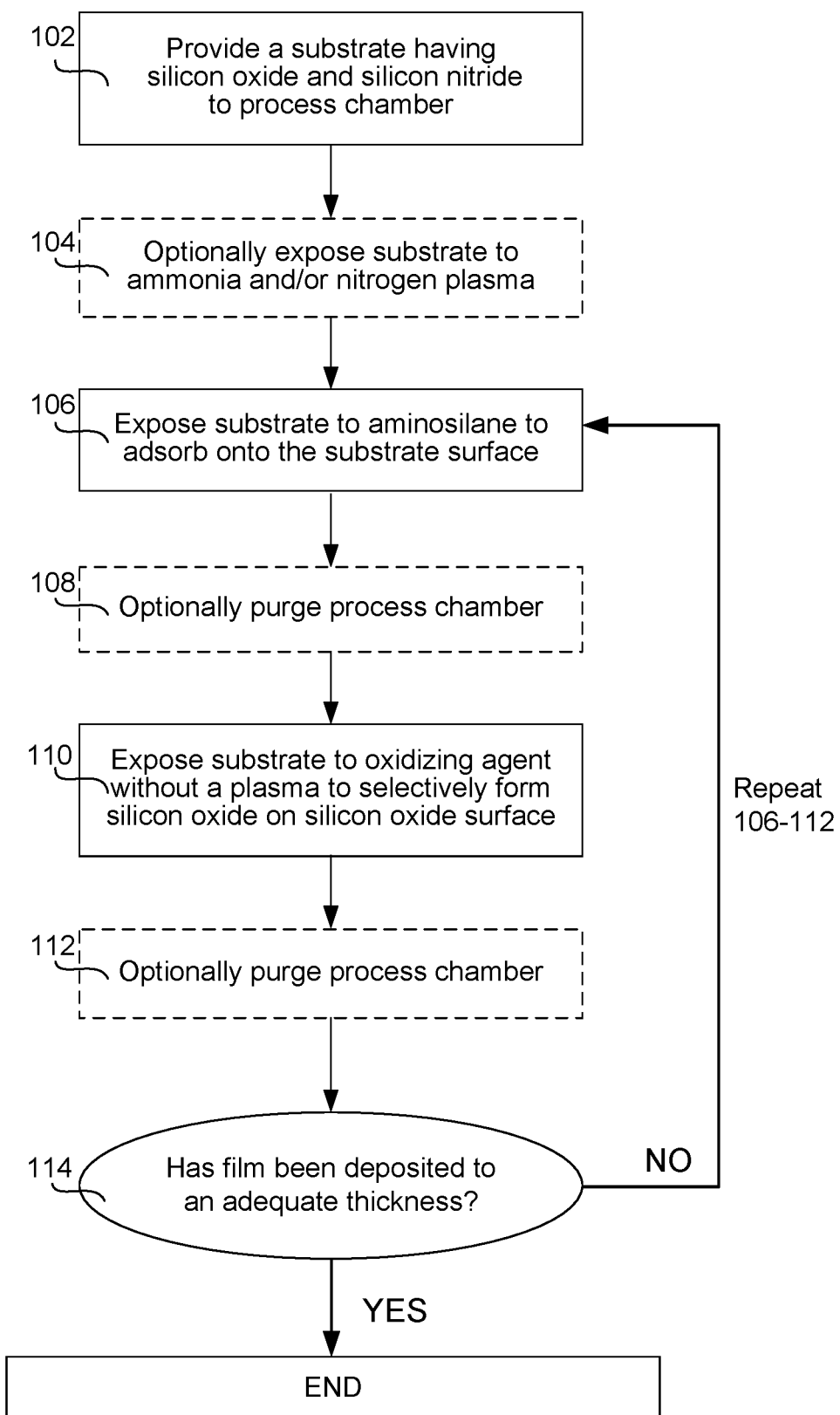
FIG. 1 is a process flow diagram depicting operations for a method in accordance with disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often involve formation of structures that include silicon, silicon oxide, and silicon nitride. For example, some fabrication processes involve patterning techniques to form structures for microprocessors, logic, and/or memory devices. For example, multiple patterning methods include double and quad patterning techniques to extend lithographic technology beyond its optical limits. Existing techniques for multiple patterning may involve deposition and etching of materials such as silicon oxide to form spacers as a mask for patterning techniques. However, current techniques for forming such structures often involve deposition, followed by selective etching techniques.

Likewise, processes for forming self-aligned contacts and structures including gap fill of silicon oxide involve deposition techniques that are not selective to the type of substrate. Some current deposition methods result in conformal deposition process at best, or process that leads to a void formation in small features on a substrate.

Provided herein are methods of selectively depositing silicon oxide on a silicon oxide surface in the presence of an exposed silicon nitride surface. Deposition techniques are selective to depositing silicon oxide relative to silicon nitride by modulating the reactivity of the silicon nitride versus a silicon oxide surface to certain silicon-containing precursors and reactants for forming silicon oxide. Techniques described herein involve thermal atomic layer deposition (ALD). That is, in various embodiments, the reaction between a silicon-containing precursor and an oxidizing agent to form silicon oxide is performed without igniting a plasma.

ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As an example, a silicon oxide deposition cycle may include the following operations: (i) delivery/adsorption of a silicon-containing precursor, (ii) purging of the silicon precursor from the chamber, (iii) delivery of an oxygen-containing reactant or oxygen-containing gas, and (iv) purging of the oxygen-containing reactant from the chamber.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as an oxygen-containing reactant, is introduced to the chamber so that some of these molecules react with the first precursor adsorbed on the surface. In some processes, the second reactant reacts immediately with the adsorbed first precursor. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

As described, in some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

FIG. 1 provides a process flow diagram depicting example operations of a method performed in accordance with certain disclosed embodiments. In operation 102, a substrate having an exposed silicon oxide surface and exposed silicon nitride surface is provided to a process chamber. The process chamber may be set to a chamber pressure between about 10 mTorr and about 10 Torr, or between about 1 Torr and about 3 Torr. Such chamber pressures may be used throughout operations 102-114 as described herein. The substrate may be heated to a substrate temperature between about 25° C. and about 400° C., or between about 200° C. and about 300° C. It will be understood that substrate temperature as used herein refers to the temperature that the pedestal holding the substrate is set at and that in some embodiments, the substrate when provided to the process chamber on the pedestal may be heated to the desired substrate temperature prior to processing the substrate. The substrate temperature may be the same throughout operations 102-114 as described herein.

Figure 2A:
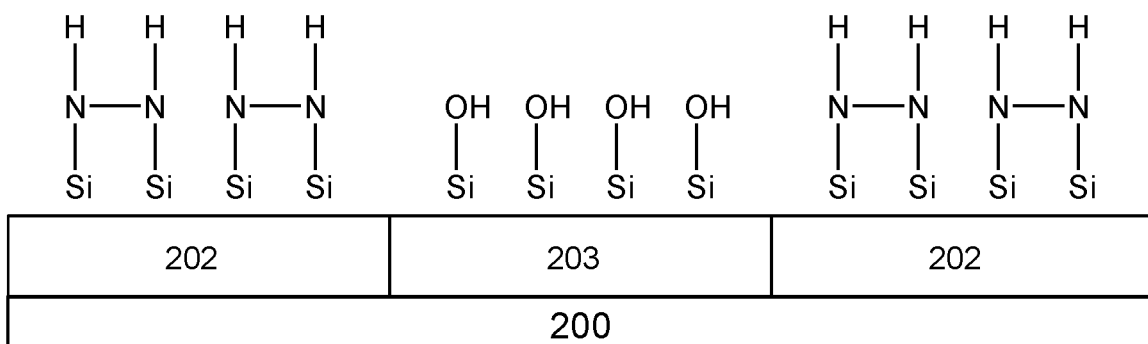
FIGS. 2A-2D are schematic illustrations of substrates undergoing operations described in accordance with certain disclosed embodiments.

The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of under-layers include dielectric layers and conducting layers, e.g., silicon oxides, silicon nitrides, silicon carbides, metal oxides, metal nitrides, metal carbides, and metal layers. In some embodiments, the substrate includes silicon oxide and silicon nitride, as shown in FIG. 2A. FIG. 2A shows a substrate 200 having an exposed silicon oxide surface 203 and exposed silicon nitride surfaces 202. The silicon oxide surface includes hydroxyl end groups, which may be formed from ambient air ($H_2O$ and $O_2$) or from a mild etchant such as 1% hydrofluoric acid (HF) in $H_2O$. The hydroxyl end groups on silicon oxide may also be formed due to the technique used to form the silicon oxide 203 material. Silicon nitride surfaces 202 include Si—NH dimers, whereby nitrogen atoms are bonded to an adjacent nitrogen atom. Such a surface may form if the silicon nitride material is deposited using chemical vapor deposition at a low temperature, such as less than 500° C. However, such surfaces may be susceptible to reacting with silicon-containing precursors used for depositing silicon oxide.

Figure 2B:
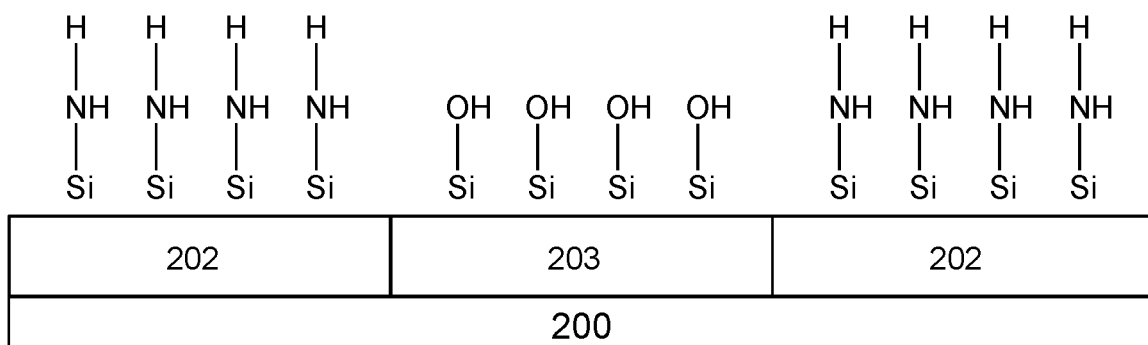

Thus, returning to FIG. 1, in operation 104, the substrate is optionally exposed to ammonia and/or nitrogen plasma. As shown in FIG. 2B, when the substrate is exposed to ammonia and/or nitrogen plasma, the Si—NH dimers are converted to primary amine groups that include single —$NH_x$ groups, which are not susceptible to reacting with the silicon-containing precursors used in certain disclosed embodiments. Primary amine groups as referred to herein are defined as groups of atoms where nitrogen is bonded to silicon and hydrogen and the nitrogen atom is not bound to another nitrogen atom. A primary amine group on the surface of a silicon nitride substrate may have the structure Si—$NH_2$. Such groups are not susceptible to reacting with silicon-containing precursors as described herein as the Si—N bond on the surface of the silicon nitride is thermodynamically identical or at least similar to the Si—N bond of the silicon-containing precursor. This prevents the silicon nitride surface 202 from reacting with the silicon-containing precursor, thereby preventing deposition of silicon oxide over this surface.

Operation 104 of FIG. 1 is optional if the substrate having silicon oxide and silicon nitride already has silicon nitride surfaces with single —$NH_x$ groups on the surface. For example, operation 104 is optional if the silicon nitride is previously deposited using CVD at a high temperature of greater than 500° C., because silicon nitride deposited using this technique and at these high temperatures are more likely to yield single NH groups on the surface of the silicon nitride material, rather than forming dimers as shown in FIG. 2A.

For embodiments where operation 104 is performed, the substrate may be exposed to ammonia and/or nitrogen plasma for a duration between about 1 second and about 10 seconds. Operation 104 may be performed at a substrate temperature between about 25° C. and about 400° C., or between about 200° C. and about 300° C. It will be understood that substrate temperature as used herein refers to the temperature that the pedestal holding the substrate is set at and that in some embodiments, the substrate when provided to the process chamber on the pedestal may be heated to the desired substrate temperature prior to processing the substrate. The substrate temperature during operation 104 may be the same as during other operations as described herein with respect to FIG. 1.

The chamber pressure during operation 104 may be between about 10 mTorr and about 10 Torr, or between about 1 Torr and about 3 Torr. The chamber pressure may be the same during operation 104 as during other operations as described herein with respect to FIG. 1.

In various embodiments, operation 104 may involve exposing only to ammonia plasma. For example, ammonia gas may be delivered to the process chamber and a plasma may be ignited.

Plasma energy may be provided to prepare the silicon nitride surface to form single amine groups on the surface of the silicon nitride. Plasma energy may be provided to activate ammonia into ions and radicals and other activated species, which react with silicon nitride amine dimers to form single amine groups. In various embodiments, the plasma is an in-situ plasma, such that the plasma is formed directly above the substrate surface in the chamber. The in-situ plasma may be ignited at a power per substrate area between about 0.2122 $W/cm^2$ and about 2.122 $W/cm^2$. For example, the power may range from about 150 W to about 6000 W, or from about 600 W to about 6000 W, or from about 800 W to about 4000 W, for a chamber processing four 300 mm wafers. For example, plasmas may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasmas may be formed by one or more suitable methods other than capacitive coupling of an RF field to a gas. In some embodiments, the plasma is a remote plasma, such that a second reactant is ignited in a remote plasma generator upstream of the chamber, then delivered to the chamber where the substrate is housed. Ammonia gas may be delivered to the process chamber at a flow rate between about 100 sccm and about 10000 sccm, or between about 5000 sccm and about 7500 sccm. In some embodiments, ammonia plasma may be generated in situ. In some embodiments, ammonia plasma may be generated in a remote plasma generator.

In various embodiments, operation 104 may involve exposing to a plasma generated from a mixture of ammonia and nitrogen gas. Here, the plasma may also be an in-situ or a remote plasma as described above. For example, ammonia gas and nitrogen gas may be delivered together as a mixture or separately to the process chamber, whereby the gases may be mixed, and a plasma may then be ignited. The in-situ plasma may be ignited at a power per substrate area between about 0.2122 $W/cm^2$ and about 2.122 $W/cm^2$. For example, the power may range from about 150 W to about 6000 W, or from about 600 W to about 6000 W, or from about 800 W to about 4000 W, for a chamber processing four 300 mm wafers. In various embodiments, a high frequency plasma is used having a frequency of at least about 13.56 MHz, or at least about 27 MHz, or at least about 40 MHz, or at least about 60 MHz. In some embodiments, a microwave-based plasma may be used.

The mixture of ammonia gas and nitrogen gas delivered to the plasma source may vary. For example, the ammonia to nitrogen gas flow rate ratio may be between about 0.01 and about 0.1. Ammonia gas may be delivered to the process chamber at a flow rate between about 10 sccm and about 100 sccm. Nitrogen gas may be delivered to the process chamber at a flow rate between about 100 sccm and about 10000 sccm. In some embodiments, the mixture of ammonia gas and nitrogen gas includes less than about 1% ammonia by volume.

In some embodiments, a carrier gas may be flowed during operation 104. The carrier gas may be an inert gas, such as helium, argon, neon, and combinations thereof. The carrier gas may be diverted such that the carrier gas is used to deliver the ammonia and/or nitrogen gas to the process chamber. In some embodiments, the carrier gas may be provided to assist with pressure and/or temperature control of the process chamber. In some embodiments, the carrier gas is used to ensure more rapid delivery of a gas to the process chamber.

In operation 106, the substrate is exposed to an aminosilane to adsorb the aminosilane onto the substrate surface. Aminosilanes referred to herein include aminosilanes, such as bis(tertbutyl)aminosilane and silylamines such as trisilylamine. In some embodiments, aminosilane molecules may adsorb onto both silicon oxide and silicon nitride surfaces, but as described below with respect to operation 110, silicon oxide is formed selectively on silicon oxide surface and not on the silicon nitride surface. In various embodiments, subsequent purge operations as described below with respect to operations 108 and 112 may remove adsorbed aminosilane from the silicon nitride surface.

In some embodiments, adsorption on the surface of the substrate may be form a thin layer of the aminosilane on the surface of the substrate. The thin layer may be less than a monolayer, and may have a thickness between about 0.2 Å and about 0.4 Å.

During operation 106, an inert gas may be flowed. The inert gas may be any inert gas, such as those listed above with respect to operation 104. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

The aminosilane used in operation 106 has a chemical formula as follows:

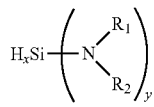

where x is an integer between and including 1 and 3, x+y=4 and each of $R_1$ and $R_2$ is hydrogen or an alkyl ligand. For example, in some embodiments, the aminosilane is monoaminosilane, which has the chemical structure:

where each of $R_1$ and $R_2$ is hydrogen or an alkyl ligand.

The aminosilane in some embodiments may be any of monoaminosilane, diaminosilane, triaminosilane, tetraaminosilane, and combinations thereof. Chemical structures for these examples are provided below:

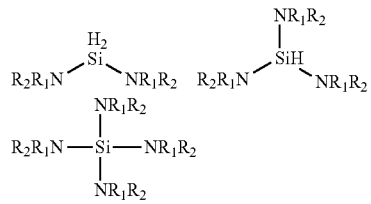

As noted above, $R_1$ and $R_2$ may be any alkyl ligand. In one example, the aminosilane may be N,N'-dimethylsilanediamine, having the structure:

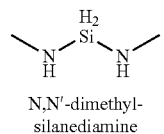

N,N'-dimethyl-
silanediamine

Silicon alkoxides, such as tetraethyl orthosilicate (TEOS), silicon halides, and silane ($SiH_4$) are not used as a silicon precursor for depositing silicon oxide in accordance with disclosed embodiments as these precursors are likely to react with the silicon nitride film and therefore may be unable to selectively deposit silicon oxide on silicon oxide in the presence of silicon nitride.

Formation of a Si—O bond using aminosilanes as described herein is thermodynamically favorable using the Si—N bond present in the aminosilane. Further, as the Si—N bond in the aminosilane is an equivalent bond to the Si—N bond on the surface of the silicon nitride film present on the substrate, there is no driving force for the aminosilane to react with the silicon nitride film, which thereby prevents formation of silicon oxide on the silicon nitride film.

In operation 108, the process chamber is optionally purged to remove aminosilane that did not adsorb onto the substrate surface. Purging the chamber may involve flowing a purge gas or a sweep gas, which may be a carrier gas used in other operations or may be a different gas. In some embodiments, purging may involve evacuating the chamber. Example purge gases include argon, nitrogen, hydrogen, and helium. In some embodiments, operation 108 may include one or more evacuation subphases for evacuating the process chamber. Alternatively, it will be appreciated that operation 108 may be omitted in some embodiments. Operation 108 may have any suitable duration, such as between about 0 seconds and about 60 seconds, for example about 0.01 seconds. In some embodiments, increasing a flow rate of one or more purge gases may decrease the duration of operation 108. For example, a purge gas flow rate may be adjusted according to various reactant thermodynamic characteristics and/or geometric characteristics of the process chamber and/or process chamber plumbing for modifying the duration of operation 108. In one non-limiting example, the duration of a purge phase may be adjusted by modulating purge gas flow rate. This may reduce deposition cycle time, which may improve substrate throughput. After a purge, the aminosilane molecules remain adsorbed onto the substrate surface. In some embodiments, the aminosilane precursor is flowed to a chamber housing the substrate at a flow rate between about 1000 sccm and about 5000 sccm.

Figure 2C:
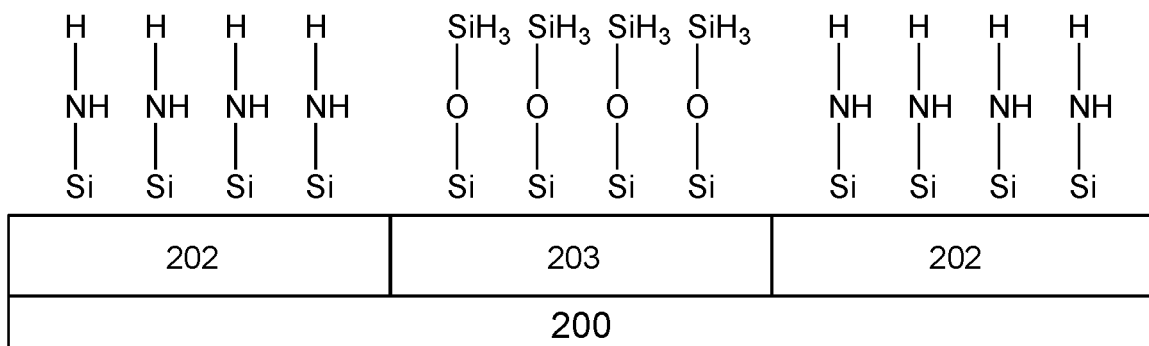
Figure 2D:
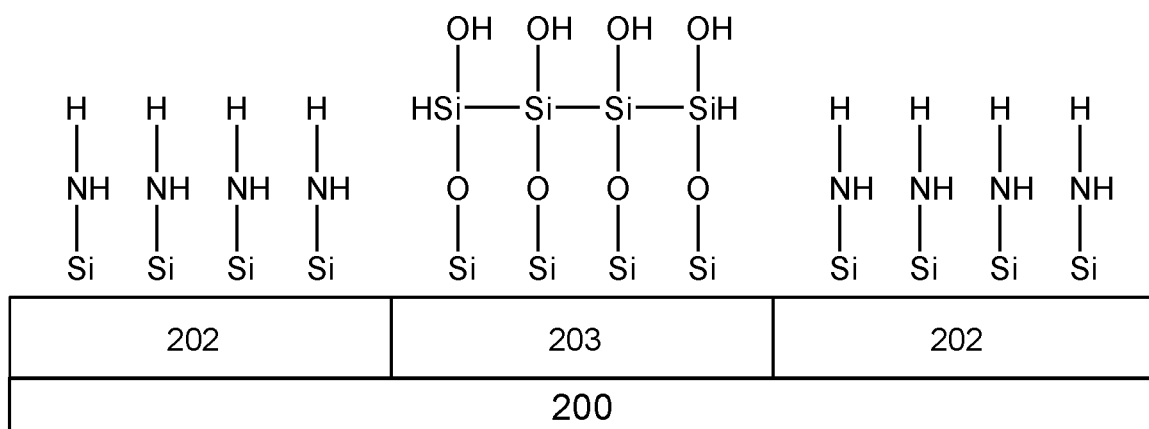

In operation 110, the substrate is exposed to an oxidizing agent without a plasma to selectively form silicon oxide on a silicon oxide surface. In some embodiments, when the oxidizing agent is provided to the substrate, the adsorbed precursor reacts with the oxidizing agent to form silicon oxide on the surface of the silicon oxide surface. In contrast, the silicon nitride surface having the same silicon-nitrogen bond as the aminosilane does not react at all or as quickly and therefore, selective deposition is achieved. FIG. 2C shows an example of the substrate from FIG. 2B, whereby monoaminosilane reacts with the surface of a silicon oxide surface, which exhibited silanol end groups as shown in FIG. 2B. The reaction between the silanol end groups and the monoaminosilane is thermodynamically favorable to form an Si—O—Si bond, and reaction with an oxidizing agent thereby forms a silicon oxide as shown in FIG. 2D, which also forms silanol end groups. Such end groups may then be subject to further deposition in subsequent deposition cycles as further described below.

Returning to FIG. 1, in operation 110, the oxidizing agent may be any one or more of the following gases: ozone, water, and peroxide. The reaction between the aminosilane and the oxidizing agent is a thermal reaction such that plasma is not necessary to drive the reaction. Thus, oxygen and nitrous oxide are not used as oxidizing agents in disclosed embodiments as reactions for forming silicon oxide using an aminosilane and oxygen or nitrous oxide involves igniting a plasma. In some embodiments, the oxidizing agent is flowed into a chamber housing the substrate at a flow rate between about 1000 sccm and about 5000 sccm.

In operation 112, the chamber is optionally purged to remove any residual byproducts. Operation 112 may be performed using any of the conditions described above with respect to operation 108.

In operation 114, it is determined whether the desired thickness of film has been deposited. If not, operations 106-112 are repeated in sufficient cycles to deposit a desired thickness of silicon oxide film selectively on silicon oxide relative to silicon nitride. Any suitable number of deposition cycles may be included in an ALD process to deposit a desired film thickness of silicon oxide. For example, about fifty deposition cycles may be performed to deposit a film on the substrate using disclosed embodiments.

Figure 3:
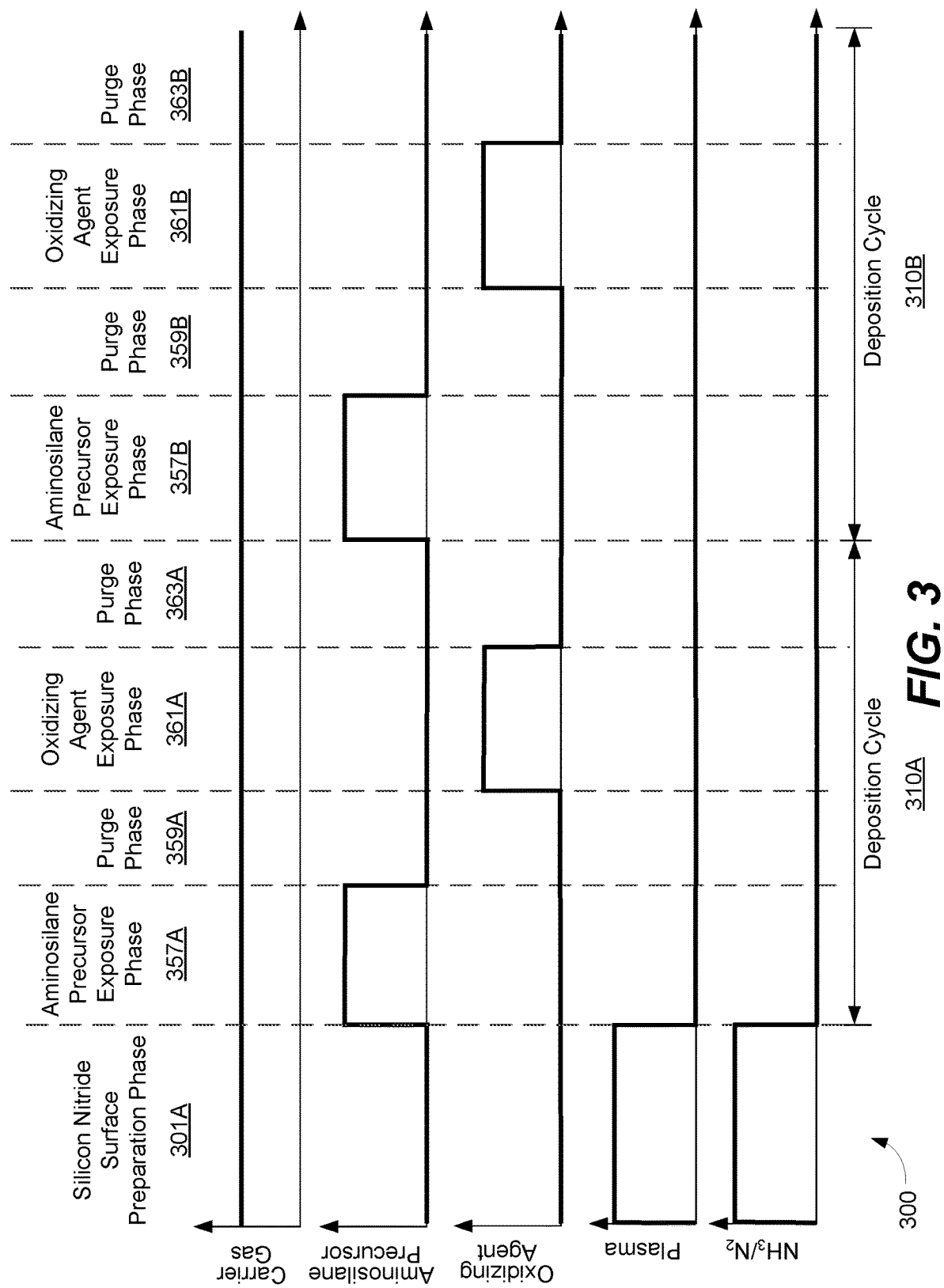
FIG. 3 is a timing sequence diagram showing an example of cycles in a method in accordance with certain disclosed embodiments.

FIG. 3 is a timing sequence diagram of example pulses in accordance with disclosed embodiments. FIG. 3 shows phases in an example ALD process 300, for various process parameters, such as ammonia and/or nitrogen gas flow, carrier gas or purge gas flow, aminosilane precursor flow, oxidizing agent flow, and plasma status. The lines indicate when the flow is turned on and off and when the plasma is turned on and off. Various disclosed embodiments depend on process parameters that include, but are not limited to, flow rates for inert and reactant species, flow rates for nitrogen and/or ammonia pre-treatment gases, plasma conditions during pre-treatment, substrate temperature, and process chamber pressure.

Process 300 includes two deposition cycles: deposition cycle 310A and deposition cycle 310B. Deposition cycle 310A includes silicon nitride preparation phase 301A, whereby ammonia/nitrogen ($NH_3/N_2$) flow is turned on and a plasma is on. Carrier gas flow may also be turned on, whilst aminosilane precursor and oxidizing agent flows are turned off. This phase may correspond to operation 104 of FIG. 1. Following silicon nitride surface preparation phase 301A, deposition cycle 310A includes aminosilane precursor exposure phase 357A, whereby carrier gas continues to flow, aminosilane precursor gas flow is turned on, oxidizing agent flow remains off, plasma is turned off, and $NH_3/N_2$ gas flow is turned off. This phase may correspond to operation 106 of FIG. 1. During purge phase 359A, the carrier gas flow continues to flow to purge out excess aminosilane precursors remaining in gas phase, while aminosilane precursor, oxidizing agent, and $NH_3/N_2$ flows are turned off and the plasma is turned off. This may correspond to operation 108 of FIG. 1. In oxidizing agent exposure phase 361A, carrier gas is flowed and oxidizing agent flow is turned on, while aminosilane precursor flow and $NH_3/N_2$ flow are turned off. Plasma is likewise turned off during this phase. This phase may correspond to operation 110 of FIG. 1. Purge phase 363A includes carrier gas flow while aminosilane precursor flow, oxidizing agent flow, and $NH_3/N_2$ flow are turned off and the plasma is turned off. This may correspond to operation 112 of FIG. 1. Deposition cycle 310A is repeated in deposition cycle 310B, which includes aminosilane precursor exposure phase 357B, purge phase 359B, oxidizing agent exposure phase 361B, and purge phase 363B, each of which may involve the same gas flows and plasma status as in aminosilane precursor exposure phase 357A, purge phase 359A, oxidizing agent exposure phase 361A, and purge phase 363A, respectively.

Apparatus

Figure 4:
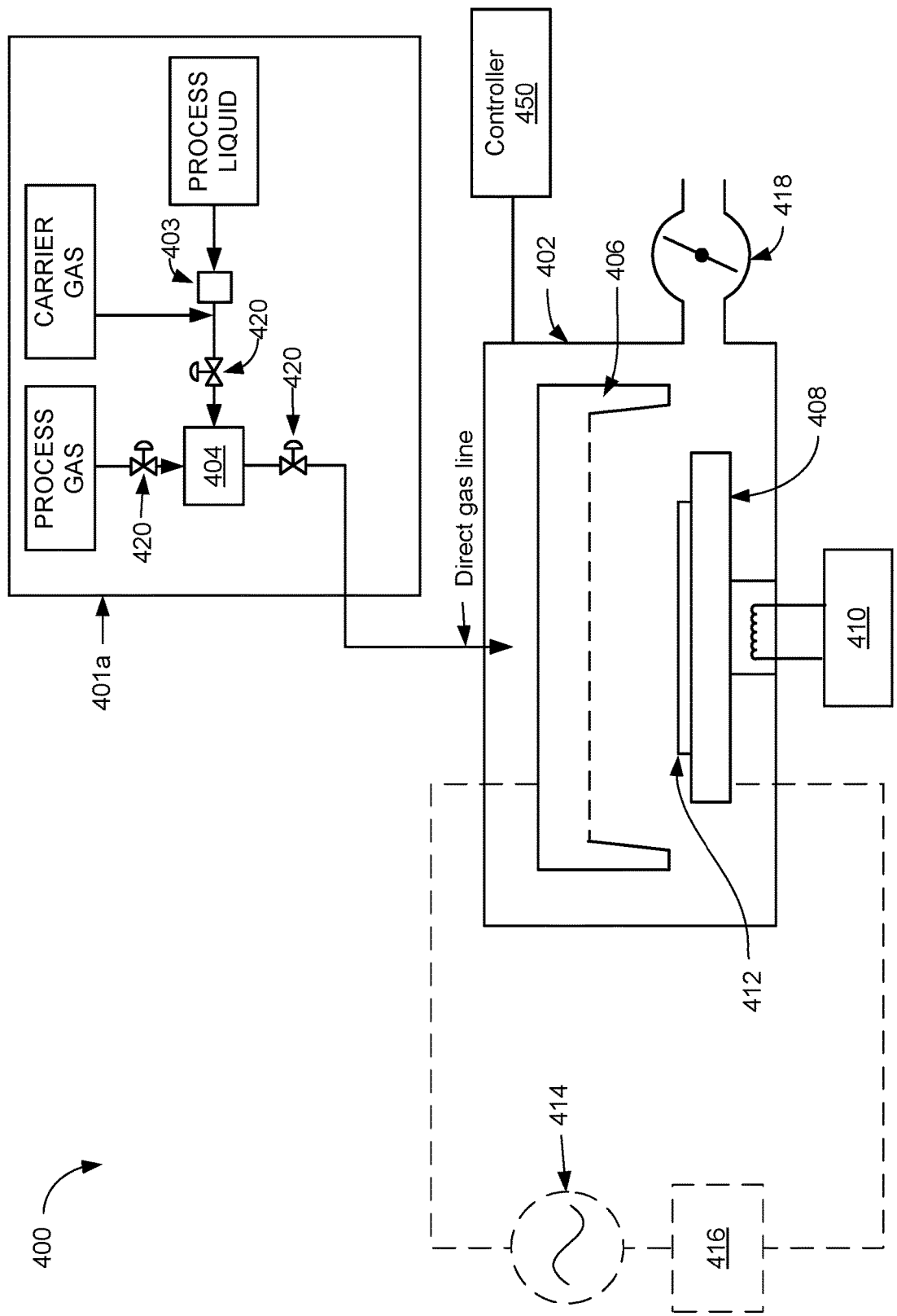
FIG. 4 is a schematic diagram of an example process chamber for performing disclosed embodiments.
Figure 5:
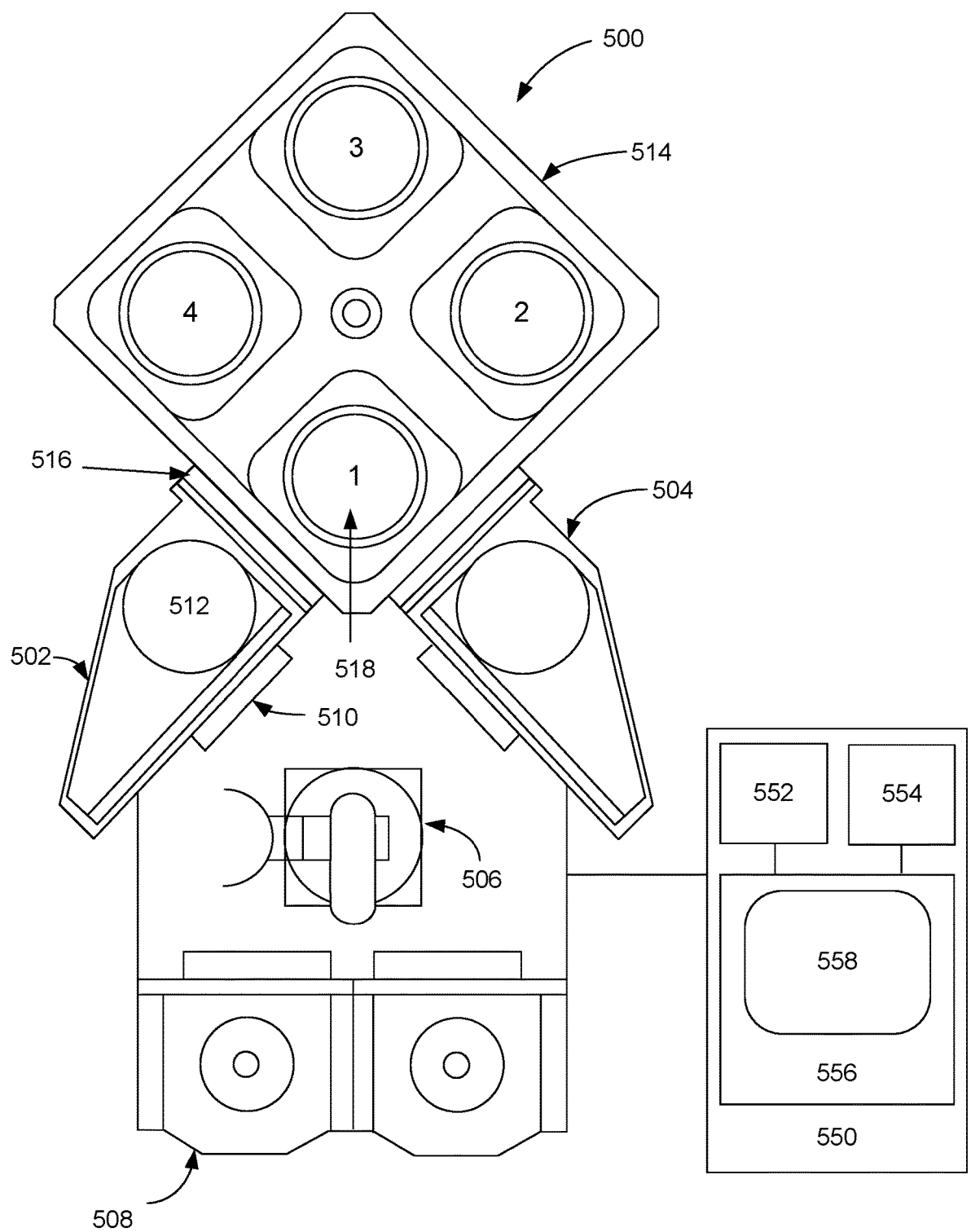
FIG. 5 is a schematic diagram of an example process tool for performing disclosed embodiments.

FIG. 4 depicts a schematic illustration of an embodiment of an atomic layer deposition (ALD) process station 400 having a process chamber body 402 for maintaining a low-pressure environment. A plurality of ALD process stations 400 may be included in a common low pressure process tool environment. For example, FIG. 5 depicts an embodiment of a multi-station processing tool 500. In some embodiments, one or more hardware parameters of ALD process station 400 including those discussed in detail below may be adjusted programmatically by one or more computer controllers 450.

ALD process station 400 fluidly communicates with reactant delivery system 401a for delivering process gases to a distribution showerhead 406. Reactant delivery system 401a includes a mixing vessel 404 for blending and/or conditioning process gases, such as an aminosilane precursor gas, or oxidizing agent gas (e.g., ozone), or ammonia and/or nitrogen gas, for delivery to showerhead 406. One or more mixing vessel inlet valves 420 may control introduction of process gases to mixing vessel 404. Nitrogen plasma and/or ammonia plasma may also be delivered to the showerhead 406 or may be generated in the ALD process station 400.

As an example, the embodiment of FIG. 4 includes a vaporization point 403 for vaporizing liquid reactant to be supplied to the mixing vessel 404. In some embodiments, vaporization point 403 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 403 may be heat traced. In some examples, mixing vessel 404 may also be heat traced. In one non-limiting example, piping downstream of vaporization point 403 has an increasing temperature profile extending from approximately 100° C. to approximately 150° C. at mixing vessel 404.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 403. In one scenario, a liquid injector may be mounted directly to mixing vessel 404. In another scenario, a liquid injector may be mounted directly to showerhead 406.

In some embodiments, a liquid flow controller (LFC) upstream of vaporization point 403 may be provided for controlling a mass flow of liquid for vaporization and delivery to process station 400. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 406 distributes process gases toward substrate 412. In the embodiment shown in FIG. 4, the substrate 412 is located beneath showerhead 406 and is shown resting on a pedestal 408. Showerhead 406 may have any suitable shape, and may have any suitable number and arrangement of ports for distributing process gases to substrate 412.

In some embodiments, pedestal 408 may be raised or lowered to expose substrate 412 to a volume between the substrate 412 and the showerhead 406. It will be appreciated that, in some embodiments, pedestal height may be adjusted programmatically by a suitable computer controller 450.

In another scenario, adjusting a height of pedestal 408 may allow a plasma density to be varied during plasma activation cycles in the process in embodiments where a plasma is ignited. At the conclusion of the process phase, pedestal 408 may be lowered during another substrate transfer phase to allow removal of substrate 412 from pedestal 408.

In some embodiments, pedestal 408 may be temperature controlled via heater 410. In some embodiments, the pedestal 408 may be heated to a temperature of at least about 250° C., or in some embodiments, less than about 300° C., such as about 250° C., during deposition of silicon nitride films as described in disclosed embodiments. In some embodiments, the pedestal is set at a temperature between about 50° C. and about 300° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for process station 400 may be provided by butterfly valve 418. As shown in the embodiment of FIG. 4, butterfly valve 418 throttles a vacuum provided by a downstream vacuum pump (not shown). However, in some embodiments, pressure control of process station 400 may also be adjusted by varying a flow rate of one or more gases introduced to the process station 400.

In some embodiments, a position of showerhead 406 may be adjusted relative to pedestal 408 to vary a volume between the substrate 412 and the showerhead 406. Further, it will be appreciated that a vertical position of pedestal 408 and/or showerhead 406 may be varied by any suitable mechanism within the scope of the present disclosure. In some embodiments, pedestal 408 may include a rotational axis for rotating an orientation of substrate 412. It will be appreciated that, in some embodiments, one or more of these example adjustments may be performed programmatically by one or more suitable computer controllers 450.

In some embodiments where plasma may be used as discussed above, showerhead 406 and pedestal 408 electrically communicate with a radio frequency (RF) power supply 414 and matching network 416 for powering a plasma. In some embodiments, the plasma energy may be controlled by controlling one or more of a process station pressure, a gas concentration, an RF source power, an RF source frequency, and a plasma power pulse timing. For example, RF power supply 414 and matching network 416 may be operated at any suitable power to form a plasma having a desired composition of radical species. Examples of suitable powers are about 150 W to about 6000 W. Plasma may be used during treatment of a silicon nitride surface prior to selective deposition of silicon oxide on silicon oxide relative to silicon nitride. RF power supply 414 may provide RF power of any suitable frequency. In some embodiments, RF power supply 414 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 450 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or an ammonia and/or nitrogen reactant gas, instructions for setting a flow rate of a carrier gas (such as argon), instructions for igniting a plasma, and time delay instructions for the first recipe phase. A second recipe phase may include instructions for setting a flow rate of an inert and/or aminosilane silicon precursor gas, instructions for setting a flow rate of a carrier gas (such as argon), and time delay instructions for a second recipe phase. A third, subsequent recipe phase may include instructions for modulating or stopping a flow rate of an inert and/or a reactant gas, and instructions for modulating a flow rate of a carrier or purge gas and time delay instructions for the third recipe phase. A fourth recipe phase may include instructions for modulating a flow rate of an oxidizing agent gas such as ozone, instructions for modulating the flow rate of a carrier or purge gas, and time delay instructions for the fourth recipe phase. A fifth, subsequent recipe phase may include instructions for modulating or stopping a flow rate of an inert and/or a reactant gas, and instructions for modulating a flow rate of a carrier or purge gas and time delay instructions for the fifth recipe phase. It will be appreciated that these recipe phases may be further subdivided and/or iterated in any suitable way within the scope of the disclosed embodiments. In some embodiments, the controller 450 may include any of the features described below with respect to system controller 550 of FIG. 5.

As described above, one or more process stations may be included in a multi-station processing tool. FIG. 5 shows a schematic view of an embodiment of a multi-station processing tool 500 with an inbound load lock 502 and an outbound load lock 504, either or both of which may include a remote plasma source. A robot 506 at atmospheric pressure is configured to move wafers from a cassette loaded through a pod 508 into inbound load lock 502 via an atmospheric port 510. A wafer is placed by the robot 506 on a pedestal 512 in the inbound load lock 502, the atmospheric port 510 is closed, and the load lock is pumped down. Where the inbound load lock 502 includes a remote plasma source, the wafer may be exposed to a remote plasma treatment to treat the silicon nitride surface in the load lock prior to being introduced into a processing chamber 514. Further, the wafer also may be heated in the inbound load lock 502 as well, for example, to remove moisture and adsorbed gases. Next, a chamber transport port 516 to processing chamber 514 is opened, and another robot (not shown) places the wafer into the reactor on a pedestal of a first station shown in the reactor for processing. While the embodiment depicted in FIG. 5 includes load locks, it will be appreciated that, in some embodiments, direct entry of a wafer into a process station may be provided.

The depicted processing chamber 514 includes four process stations, numbered from 1 to 4 in the embodiment shown in FIG. 5. Each station has a heated pedestal (shown at 518 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 514 may include one or more matched pairs of ALD and plasma-enhanced ALD process stations. While the depicted processing chamber 514 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 5 depicts an embodiment of a wafer handling system for transferring wafers within processing chamber 514. In some embodiments, wafer handling system may transfer wafers between various process stations and/or between a process station and a load lock. It will be appreciated that any suitable wafer handling system may be employed. Non-limiting examples include wafer carousels and wafer handling robots. FIG. 5 also depicts an embodiment of a system controller 550 employed to control process conditions and hardware states of process tool 500. System controller 550 may include one or more memory devices 556, one or more mass storage devices 554, and one or more processors 552. Processor 552 may include a CPU or computer, analog and/or digital input/output connections, stepper motor controller boards, etc.

In some embodiments, system controller 550 controls all of the activities of process tool 500. System controller 550 executes system control software 558 stored in mass storage device 554, loaded into memory device 556, and executed on processor 552. Alternatively, the control logic may be hard coded in the controller 550. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 558 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 500. System control software 558 may be configured in any suitable way. For example, various process tool component subroutines or control objects may be written to control operation of the process tool components used to carry out various process tool processes. System control software 558 may be coded in any suitable computer readable programming language.

In some embodiments, system control software 558 may include input/output control (IOC) sequencing instructions for controlling the various parameters described above. Other computer software and/or programs stored on mass storage device 554 and/or memory device 556 associated with system controller 550 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 518 and to control the spacing between the substrate and other parts of process tool 500.

A process gas control program may include code for controlling gas composition (e.g., aminosilane gases, and oxidizing agent gases, ammonia, nitrogen, carrier gases and/or purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 550. The user interface may include a display screen, graphical software displays of the apparatus and/or process conditions, and user input devices such as pointing devices, keyboards, touch screens, microphones, etc.

In some embodiments, parameters adjusted by system controller 550 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 550 from various process tool sensors. The signals for controlling the process may be output on the analog and digital output connections of process tool 500. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 550 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 550 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 550.

In some implementations, the system controller 550 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 550, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 550 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 550 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 550, in some implementations, may be a part of or coupled to a computer that is integrated with, coupled to the system, otherwise networked to the system, or a combination thereof. For example, the system controller 550 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 550 receives instructions in the form of data, which specify parameters for each of the processing steps to be performed during one or more operations. It should be understood that the parameters may be specific to the type of process to be performed and the type of tool that the system controller 550 is configured to interface with or control. Thus as described above, the system controller 550 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 550 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of depositing silicon oxide selectively on an exposed silicon oxide surface, the method comprising:
   providing a substrate having the exposed silicon oxide surface and an exposed silicon nitride surface, the exposed silicon nitride surface comprising primary amine groups;
   exposing the substrate to an aminosilane to selectively adsorb the aminosilane to the exposed silicon oxide surface relative to the exposed silicon nitride surface to form an adsorbed aminosilane on the exposed silicon oxide surface; and
   performing a thermal atomic layer deposition reaction comprising exposing the substrate to an oxidizing agent, whereby the thermal atomic layer deposition reaction forms silicon oxide on the exposed silicon oxide surface relative to the exposed silicon nitride surface.

2. The method of claim 1, further comprising, prior to providing the substrate, depositing silicon nitride to form an untreated silicon nitride surface; and exposing the untreated silicon nitride surface to ammonia and igniting a plasma for a duration between about 1 second and about 10 seconds to form the exposed silicon nitride surface comprising primary amine groups.

3. The method of claim 1, further comprising, prior to providing the substrate, depositing silicon nitride to form an untreated silicon nitride surface and exposing the untreated silicon nitride surface to a mixture of nitrogen and ammonia and igniting a plasma for a duration between about 1 second and about 10 seconds to form the exposed silicon nitride surface comprising primary amine groups.

4. The method of claim 3, wherein amount of ammonia in the mixture of nitrogen and ammonia is less than about 1% by volume.

5. The method of claim 1, further comprising forming the exposed silicon nitride surface comprising primary amine groups by chemical vapor deposition at a deposition temperature greater than about 500° C.

6. The method of claim 1, wherein the thermal atomic layer deposition reaction is performed at a deposition temperature between about 25° C. and about 400° C.

7. The method of claim 1, wherein, during the thermal atomic layer deposition reaction, the substrate is housed in a chamber having a chamber pressure between about 10 mTorr and about 10 Torr during selective deposition of the silicon oxide.

8. The method of claim 1, wherein exposing the substrate to the aminosilane comprises flowing the aminosilane at a flow rate between about 1000 sccm and about 5000 sccm.

9. The method of claim 1, wherein exposing the substrate to the oxidizing agent comprises flowing the oxidizing agent at a flow rate between about 1000 sccm and about 5000 sccm.

10. The method of claim 1, wherein the aminosilane is selected from the group consisting of monoaminosilane, diaminosilane, triaminosilane, tetraaminosilane, and combinations thereof.

11. The method of claim 1, wherein the oxidizing agent is selected from the group consisting of ozone, water, peroxide, and combinations thereof.

12. The method of claim 2, wherein the plasma is ignited using a plasma power between about 150 W and about 6000 W.

13. The method of claim 3, wherein the plasma is ignited using a plasma power between about 150 W and about 6000 W.

14. The method of claim 3, wherein mixture of ammonia gas and nitrogen gas includes a flow rate ratio of ammonia gas flow rate to nitrogen gas flow rate between about 0.01 and about 0.1.

15. The method of claim 14, wherein the ammonia gas flow rate is between about 10 sccm and about 100 sccm.

16. The method of claim 1, wherein the silicon oxide is formed by reacting the oxidizing agent with the adsorbed aminosilane to form the silicon oxide.

* * * * *